United States Patent
Ma et al.

(10) Patent No.: US 7,704,870 B2
(45) Date of Patent: Apr. 27, 2010

(54) VIA-FIRST INTERCONNECTION PROCESS USING GAP-FILL DURING TRENCH FORMATION

(75) Inventors: Hong Ma, Singapore (SG); Shi-Jie Bai, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 12/179,838

(22) Filed: Jul. 25, 2008

(65) Prior Publication Data
US 2009/0023287 A1    Jan. 22, 2009

Related U.S. Application Data

(62) Division of application No. 11/778,844, filed on Jul. 17, 2007.

(51) Int. Cl.
*H01L 21/4763* (2006.01)
(52) U.S. Cl. .................. 438/618; 257/E21.294
(58) Field of Classification Search .......... 438/618; 257/E21.294
See application file for complete search history.

(56) References Cited

U.S. PATENT DOCUMENTS 6,265,307 B1    7/2001   Lou

2005/0110152 A1*   5/2005   Wang et al. .............. 257/760
2005/0118800 A1*   6/2005   Brakensiek et al. ....... 438/633
2006/0286794 A1*  12/2006   Lin et al. ................ 438/637

OTHER PUBLICATIONS

Chinese First Examination Report of China Application No. 200710138367X, dated Jul. 17, 2009.

* cited by examiner

*Primary Examiner*—Matthew Smith
*Assistant Examiner*—Walter H Swanson
(74) *Attorney, Agent, or Firm*—J.C. Patents

(57) ABSTRACT

An interconnection process is described. A substrate having a conductive region formed therein is provided. A dielectric layer is formed on the substrate. A patterned metal hard mask layer having a trench opening is formed on the dielectric layer. A dielectric hard mask layer is formed conformally on the patterned metal hard mask layer and filled in the trench opening. A photoresist pattern is defined to remove a portion of the dielectric hard mask layer and a portion of the dielectric layer to form a first opening in the dielectric layer. The photoresist pattern is removed. A first etching process is performed using the patterned metal hard mask layer as a mask to form a trench and a second opening extending downward from the first opening in the dielectric layer. The second opening exposes the conductive region. A conductive layer is formed in the trench and the second opening.

11 Claims, 7 Drawing Sheets

VIA-FIRST INTERCONNECTION PROCESS USING GAP-FILL DURING TRENCH FORMATION

CROSS-REFERENCE TO RELATED APPLICATION

This application is a divisional of an application Ser. No. 11/778,844, filed on Jul. 17, 2007, now pending. The entirety of each of the above-mentioned patent applications is hereby incorporated by reference herein and made a part of this specification.

BACKGROUND OF THE INVENTION

1. Field of the Invention

The present invention relates to a semiconductor manufacturing process. More particularly, the present invention relates to an interconnection process.

2. Description of Related Art

With the development of semiconductor technology, the sizes of the semiconductor devices have become smaller and smaller. As the integration degree of integrated circuits (IC) is up to a certain level, a die surface is insufficient for forming all interconnects thereon. Hence, multi-level interconnects are adopted in current very-large scale integrated (VLSI) circuits.

As regards to the current process of manufacturing a metallic interconnect, a damascene technique is often employed. In a damascene process, openings are formed in a dielectric layer in most cases, and metal is then filled in the openings to form an interconnect. Furthermore, due to the difficulties in etching copper in the current semiconductor production process, copper conductive wires are usually fabricated by implementing the damascene process instead of the conventional etching process.

In the normal damascene process, a metal hard mask layer made of titanium nitride (TiN) is formed on a dielectric layer and a dielectric hard mask layer is formed on the metal hard mask layer before performing an etching process to form openings. Next, a first etching process is carried out in a first reaction chamber to pattern the dielectric hard mask layer. Afterwards, a second etching process is implemented with use of the patterned dielectric hard mask layer as a mask in a second reaction chamber to pattern the metal hard mask layer. Thereafter, another etching process is performed with use of the patterned dielectric hard mask layer and the patterned metal hard mask layer as a mask to form the opening in the dielectric layer.

Besides, to simplify the etching process in the aforementioned fabrication, a SiON layer may be formed on the metal hard mask layer, and the SiON layer and the metal hard mask layer are respectively etched with use of a $CF_4$-containing etching gas and a $Cl_2$-containing etching gas in one reaction chamber, so as to form a patterned SiON mask layer and a patterned metal hard mask layer. Thereafter, another etching process is performed with use of the patterned SiON mask layer and the patterned metal hard mask layer as a mask to form the opening in the dielectric layer.

However, since the $CF_4$-containing etching gas and the $Cl_2$-containing etching gas are utilized to respectively etch the SiON layer and the metal hard mask layer in the reaction chamber, a fluorinated polymer and a chlorinated polymer may be simultaneously generated in the reaction chamber, impairing the particle performance during the etching process and adversely affecting the subsequent manufacturing process.

SUMMARY OF THE INVENTION

The present invention is directed to an interconnection process capable of improving the particle performance during an etching process.

The present invention is further directed to an interconnection process able to simplify a manufacturing process.

The present invention is further directed to an interconnection process capable of improving the particle performance in a reaction chamber and simplifying a manufacturing process.

The present invention provides an interconnection process. The interconnection process includes firstly providing a substrate having a conductive region formed therein. Then, a dielectric layer is formed on the substrate. Next, a patterned metal hard mask layer having a trench opening is formed on the dielectric layer. After that, a dielectric hard mask layer is formed conformally on the patterned metal hard mask layer and filled in the trench opening. Thereafter, a photoresist pattern is defined to remove a portion of the dielectric hard mask layer and a portion of the dielectric layer in the trench opening to form a first opening in the dielectric layer. Afterwards, a first etching process is performed with use of the patterned metal hard mask layer as a mask to form a trench and a second opening extending downward from the first opening in the dielectric layer. The second opening exposes the conductive region. Ultimately, a conductive layer is formed in the trench and the second opening.

According to one embodiment of the present invention, the material of the dielectric hard mask layer is, for example, silicon oxide.

According to one embodiment of the present invention, the material of the patterned metal hard mask layer is, for example, TiN, tantalum nitride (TaN) or a titanium-tungsten alloy.

According to one embodiment of the present invention, the conductive region is, for example, a conductive wire or an electrode.

According to one embodiment of the present invention, the material of the dielectric layer is, for example, a dielectric material with low dielectric constant.

According to one embodiment of the present invention, the material of the conductive layer is, for example, copper or tungsten.

According to one embodiment of the present invention, a method of forming the first opening includes, for example, firstly forming a patterned photoresist layer on the dielectric hard mask layer. Then, a second etching process is performed with use of the patterned photoresist layer as a mask to remove a portion of the dielectric hard mask layer and a portion of the dielectric layer. Finally, the patterned photoresist layer is removed.

According to one embodiment of the present invention, a cap layer may be further formed on the substrate before the step of forming the dielectric layer.

According to one embodiment of the present invention, a polishing stop layer or a glue layer may be further formed on the dielectric layer after the dielectric layer is formed and before the patterned metal hard mask layer is formed.

According to one embodiment of the present invention, a method of forming the conductive layer includes, for example, forming a conductive material layer over the substrate. Thereafter, a planarization process is performed to remove the conductive material layer outside the trench and the second opening.

The present invention further provides an interconnection process. The interconnection process includes firstly providing a substrate having a conductive region formed therein.

Then, a dielectric layer is formed on the substrate. Next, a patterned metal hard mask layer having a trench opening is formed on the dielectric layer. After that, a dielectric hard mask layer is formed conformally on the patterned metal hard mask layer and filled in the trench opening. Next, a photoresist layer is defined to remove a portion of the dielectric hard mask layer and a portion of the dielectric layer in the trench opening to form an opening. The opening exposes the conductive region. Thereafter, a passivation layer is formed in the opening. The photoresist layer is removed. Then, a first etching process is performed with use of the patterned metal hard mask layer as a mask to form a trench in the dielectric layer. Afterwards, the passivation layer is removed. Ultimately, a conductive layer is formed in the trench and the opening.

According to one embodiment of the present invention, a method of forming the opening includes, for example, firstly forming a patterned photoresist layer on the dielectric hard mask layer. Then, a second etching process is performed with use of the patterned photoresist layer as a mask to remove a portion of the dielectric hard mask layer and a portion of the dielectric layer until the conductive region is exposed. Finally, the patterned photoresist layer is removed.

According to one embodiment of the present invention, a method of forming the passivation layer includes, for example, forming a passivation material layer over the substrate. After that, an etching back process is performed to remove the passivation material layer outside the opening.

According to one embodiment of the present invention, a method of forming the conductive layer includes, for example, forming a conductive material layer over the substrate. Thereafter, a planarization process is performed to remove the conductive material layer outside the trench and the opening.

According to the present invention, before the formation of the opening, the metal hard mask layer formed on the dielectric layer is patterned. Thereafter, the dielectric hard mask layer is conformally formed on the patterned metal hard mask layer, and a photolithography process and an etching process are directly implemented to form the opening. Through omitting the process of patterning the dielectric hard mask layer and because oxynitride is replaced by the dielectric hard mask layer, the reaction that the fluoride-containing etching gases for oxynitride/patterned metal hard mask layer react with metal can be prevented, and a variety of particles in the etching chamber are prevented from generating, improving the particle performance during the etching process.

In order to the make the aforementioned and other objects, features and advantages of the present invention comprehensible, several embodiments accompanied with figures are described in detail below.

BRIEF DESCRIPTION OF THE DRAWINGS

FIGS. 2A-1 depicts, in a cross-sectional view, the semiconductor process according to an alternative embodiment of the present invention.

DESCRIPTION OF EMBODIMENTS

Figure 1A:
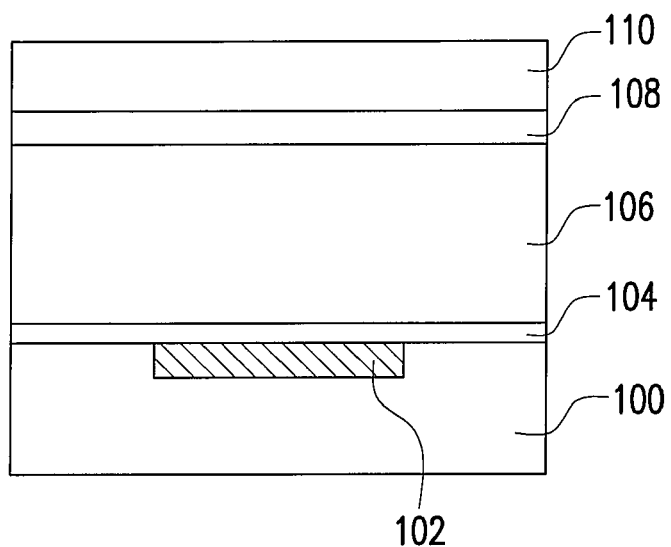
FIGS. 1A through 1E are cross-sectional schematic views illustrating a dual damascene process according to one embodiment of the present invention.

The interconnection process of the present invention will be described through a dual damascene process.

FIGS. 1A through 1E are cross-sectional schematic views illustrating a dual damascene process according to one embodiment of the present invention. First, referring to FIG. 1A, a substrate 100 having a conductive region 102 formed therein is provided. The substrate 100 is, for example, a silicon substrate. The conductive region 102 may be an electrode or a conductive wire. Next, a cap layer 104 is alternatively formed on the substrate 100. Then, a dielectric layer 106 is formed over the substrate 100. The material of the dielectric layer 106 is, for example, a dielectric material with low dielectric constant, and a method of forming the dielectric layer 106 includes performing a chemical vapor deposition (CVD) process, for example. Thereafter, a polishing stop layer or glue layer 108 is selectively formed on the dielectric layer 106. The material of the polishing stop layer or glue layer 108 is, for example, TEOS. After that, a metal hard mask layer 110 is formed on the polishing stop layer 108. The material of the metal hard mask layer 110 is, for example, TiN, TaN or a titanium-tungsten alloy, and a method of forming the metal hard mask layer 110 includes implementing the CVD process, for example. In addition, the material of the cap layer 104 and the polishing stop layer 108 and the method of forming the same are well known to people skilled in the art, and thus no further description is provided hereinafter.

Figure 1B:
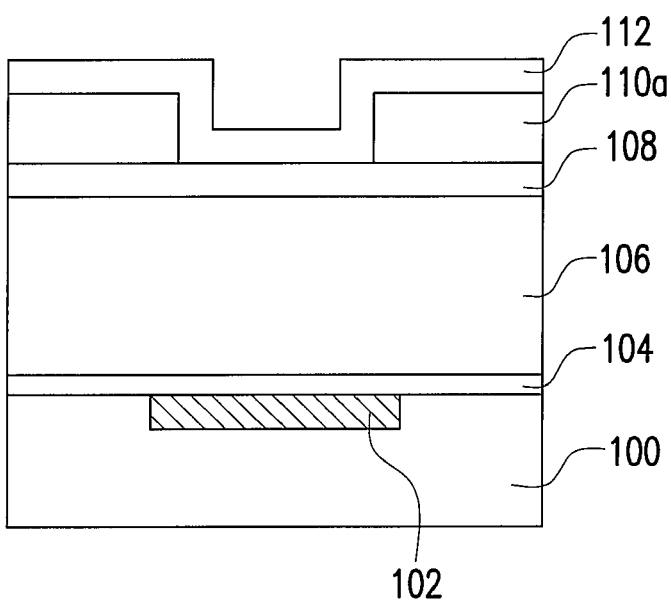

Afterwards, referring to FIG. 1B, a patterned photoresist layer (not shown) is formed on the metal hard mask layer 110, and performing an etching process with use of the patterned photoresist layer as a mask to form a patterned metal hard mask layer 110a having a trench opening. The patterned metal hard mask layer 110a exposes a region for forming a trench in the subsequent process. After that, a dielectric hard mask layer 112 is formed conformally on the patterned metal hard mask layer 110a and filled in the trench opening. The material of the dielectric hard mask layer 112 is, for example, silicon oxide, and a method of forming the dielectric hard mask layer 112 includes performing the CVD process, for example. In the present embodiment, the material of the dielectric hard mask layer 112 is, for example, silicon oxide using a tetraethyl orthosilicate (TEOS) as a gas source. However, in other embodiments, it is certain that the material of the dielectric hard mask layer 112 may be silicon carbide (SiC), SiCN or other appropriate dielectric materials. The dielectric hard mask layer 112 is employed to prevent the metal material of the patterned metal hard mask layer 110a and the etching gas from reacting and generating by-products not apt to volatilize in the subsequent etching process. The by-products include titanium fluoride (TiF3) and so on.

Figure 1C:
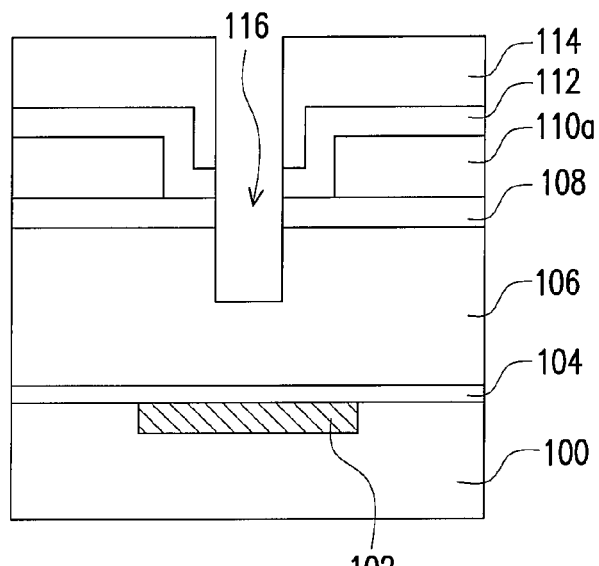

Thereafter, as shown in FIG. 1C, a patterned photoresist layer 114 is formed on the dielectric hard mask layer 112. The patterned photoresist layer 114 exposes a region for forming an opening in the subsequent process. Next, another etching process is performed with use of the patterned photoresist layer 114 as a mask to remove a portion of the dielectric hard mask layer 112, a portion of the polishing stop layer 108 and a portion of the dielectric layer 106 and to form an opening 116.

Figure 1D:
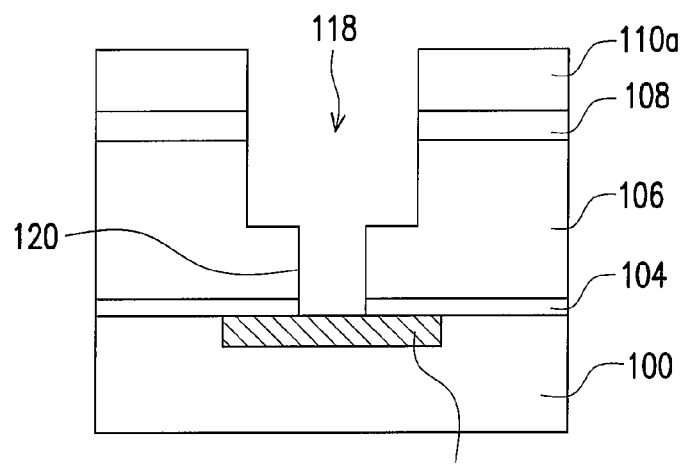

After that, referring to FIG. 1D, the patterned photoresist layer 114 is removed. Another etching process is then carried out with use of the patterned metal hard mask layer 110a as the mask to form a trench 118 and an opening 120 extending downward from opening 116 in the dielectric layer 106 in the range of the trench opening of the patterned metal hard mask layer. Here, the opening 120 exposes a portion of the cap layer 104 above the conductive region 102. Both the dielectric hard mask layer 112 and the dielectric layer 106 are made of the dielectric materials, and thus the dielectric hard mask layer 112 on the patterned metal hard mask layer 110a is also removed during the etching process. Next, the cap layer 104 exposed by the opening 120 is removed to expose a portion of the conductive region 102.

It should be noted that the metal hard mask layer 110 is patterned before the formation of the dielectric hard mask layer 112 according to the present invention. Afterwards, a photolithography process and an etching process are directly carried out to form the trench 118 and the opening 120 after the formation of the dielectric hard mask layer 112. Here, the process of patterning the dielectric hard mask layer 112 is omitted.

Moreover, in the aforesaid process, because oxynitride is replaced by oxide, it is not required to use F-containing and Cl-containing gases for oxynitride to pattern the dielectric hard mask layer and the metal hard mask layer, such that a variety of particles can be prevented from generating in a reaction chamber, improving the particle performance during the etching process.

Figure 1E:
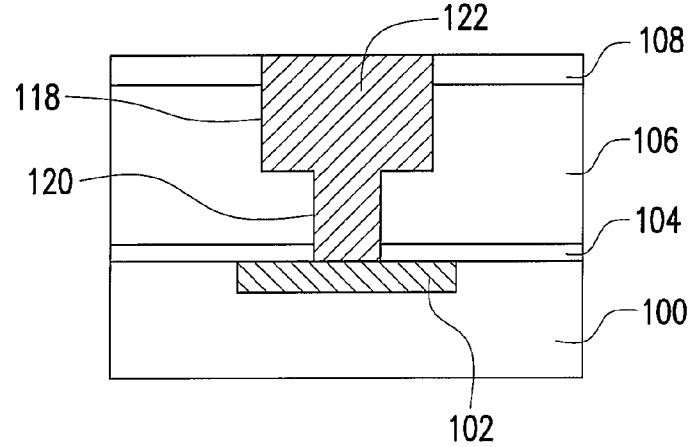

After that, referring to FIG. 1E, a conductive material layer (not shown) is formed over the substrate 100 to fill the trench 118 and the opening 120. The material of the conductive material layer is, for example, copper or tungsten. Thereafter, a planarization process is performed by implementing a chemical mechanical polishing (CMP) step to remove the conductive material layer outside the trench 118 and the opening 120 to the surface of the polishing stop layer 108, so as to form a conductive layer 122 in the trench 118 and the opening 120. Thereby, the conductive layer 122 can be electrically connected to the conductive region 102, and the dual damascene process is then completed.

Figure 2A:
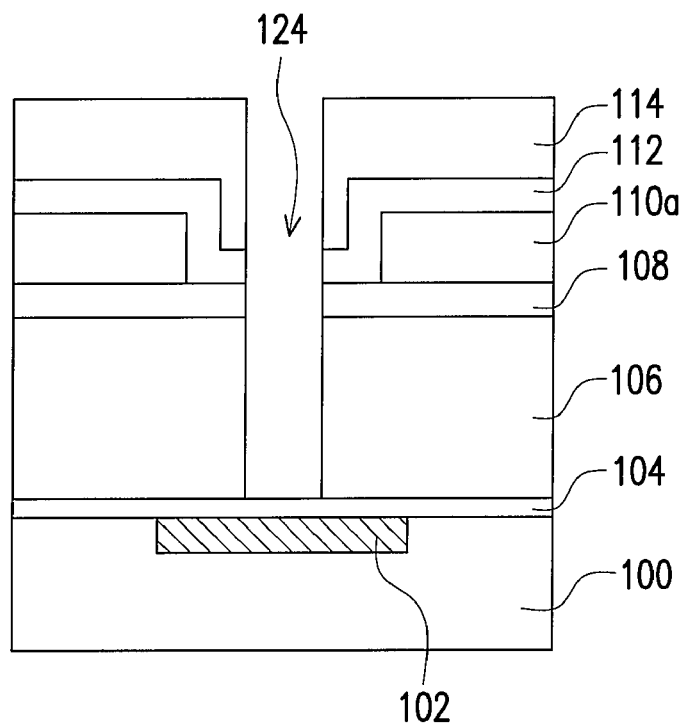
FIGS. 2A through 2D are cross-sectional schematic views illustrating a dual damascene process according to another embodiment of the present invention.

FIGS. 2A through 2D are cross-sectional schematic views illustrating a dual damascene process according to another embodiment of the present invention. FIGS. 2A-1 depicts, in a cross-sectional view, the semiconductor process according to an alternative embodiment of the present invention. The identical elements shown in FIGS. 2A and 2A-1 are designated with the same reference numbers, and detailed descriptions of the same or like elements are omitted hereinafter. First, please refer to FIG. 2A which depicts a process performed after the process illustrated in FIG. 1B. In FIG. 2A, a patterned photoresist layer 114 is formed on the dielectric hard mask layer 112. The patterned photoresist layer 114 exposes a region for forming an opening in the subsequent process. Next, another etching process is performed with use of the patterned photoresist layer 114 as a mask to remove a portion of the dielectric hard mask layer 112, a portion of the polishing stop layer 108 and a portion of the dielectric layer 106 until a portion of the cap layer 104 on the conductive region 102 is exposed, such that an opening 124 is formed. In an alternative embodiment, since the cap layer 104 is alternatively formed on the substrate 100, the dielectric layer 106 can be formed on the substrate 100 without the cap layer 104 intervening therebetween as shown in FIGS. 2A-1. In FIGS. 2A-1, after the etching process is performed to form the opening 124, a portion of the conductive region 102 is exposed due to the absence of the cap layer 104.

Figure 2B:
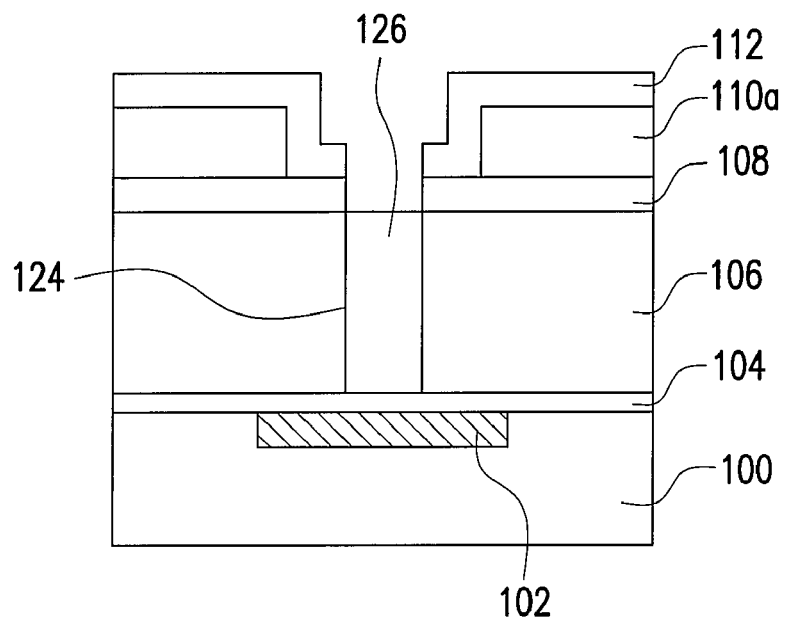
Figures 1, 2A:
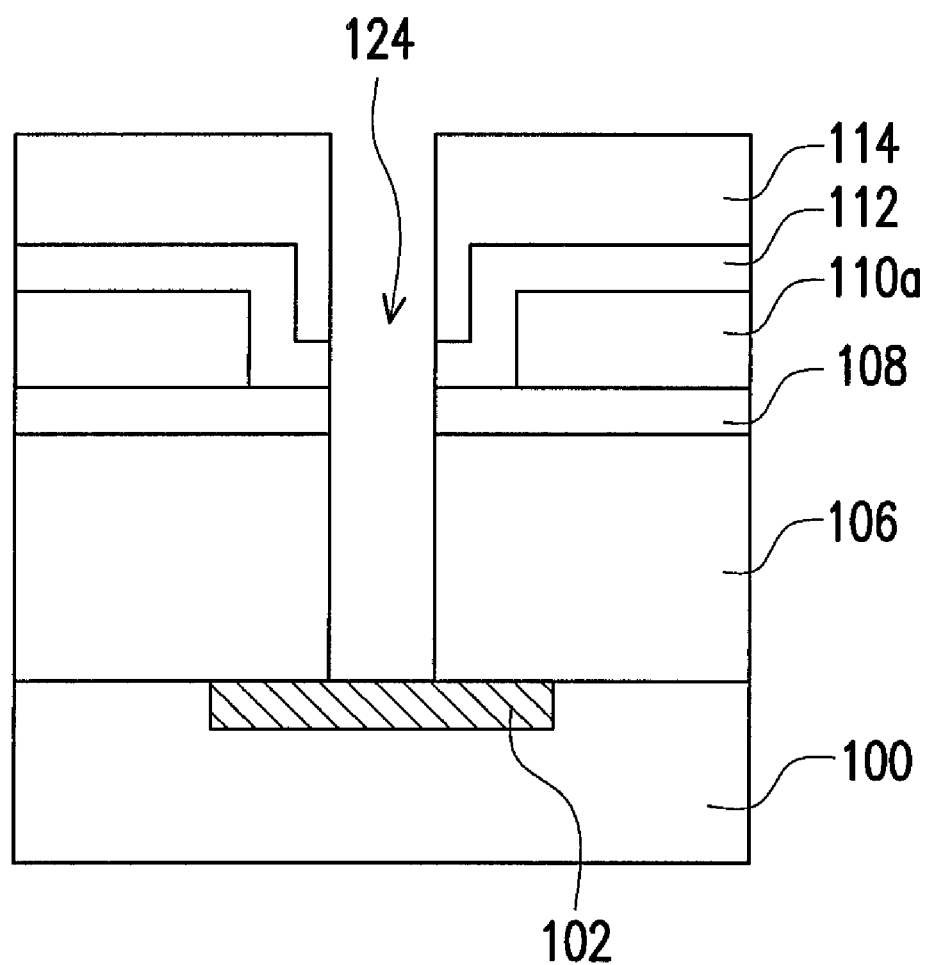

Afterwards, as shown in FIG. 2B, the patterned photoresist layer 114 is removed. A passivation material layer (not shown) is then formed over the substrate 100 to fill the opening 124. Thereafter, an etching back process is implemented to form a passivation layer 126. Here, an etching rate of the passivation layer 126 is less than or equal to that of the dielectric layer 106.

Figure 2C:
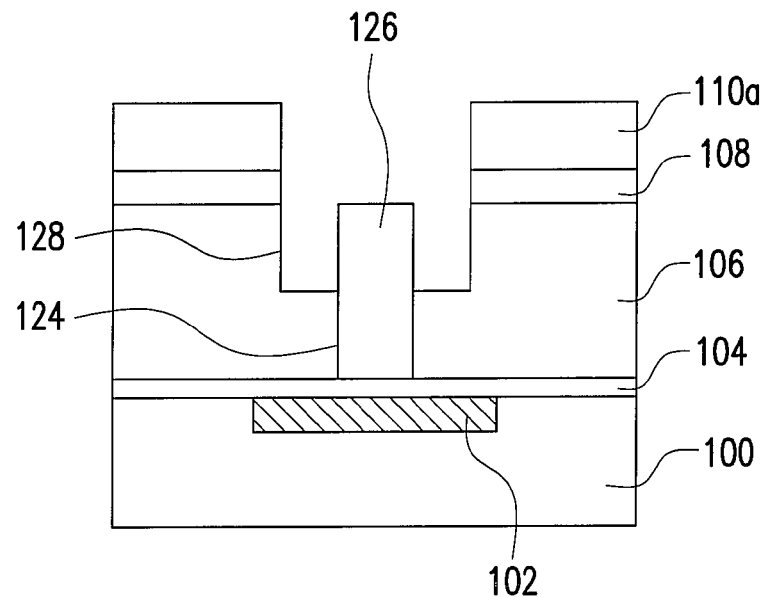

Then, referring to FIG. 2C, another etching process is performed with use of the patterned metal hard mask 110a layer as the mask to form a trench 128 in the dielectric layer 106. It should be noted that the etching rate of the passivation layer 126 is less than or equal to that of the dielectric layer 106. Therefore, as a portion of the dielectric layer 106 is removed to form the trench 128, the passivation layer 126 remains in the opening 124 to prevent the cap layer 104 at a bottom of the opening 124 from being etched.

Figure 2D:
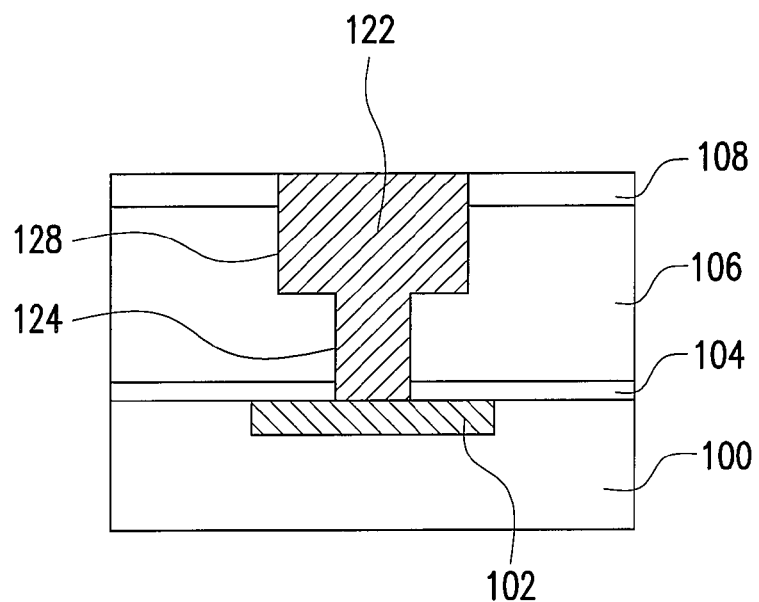

Next, referring to FIG. 2D, the passivation layer 126 is removed. A conductive layer 122 is then constructed in the trench 128 and the opening 124, such that the dual damascene process is completed.

Note that the interconnection process of the present invention can be applied not only to said dual damascene process but also to a single damascene process.

FIGS. 3A through 3D are cross-sectional schematic views illustrating a single damascene process according to another embodiment of the present invention. First, referring to FIG. 3A, a substrate 300 having a conductive region 302 formed therein is provided. The substrate 300 is, for example, a silicon substrate. The conductive region 302 may be an electrode or a conductive wire. Next, a cap layer 304 is alternatively formed on the substrate 300. Then, a dielectric layer 306 is formed over the substrate 300. The material of the dielectric layer 306 is, for example, a dielectric material with low dielectric constant, and a method of forming the dielectric layer 306 includes performing a CVD process, for example. Thereafter, a polishing stop layer 308 is selectively formed on the dielectric layer 306. After that, a metal hard mask layer 310 is formed on the polishing stop layer 308. The material of the metal hard mask layer 310 is, for example, TiN, TaN or a titanium-tungsten alloy, and a method of forming the metal hard mask layer 310 includes implementing the CVD process, for example. Likewise, the material of the cap layer 304 and the polishing stop layer 308 and the method of forming the same are well known to people skilled in the art, and thus no further description is provided hereinafter.

Figure 3A:
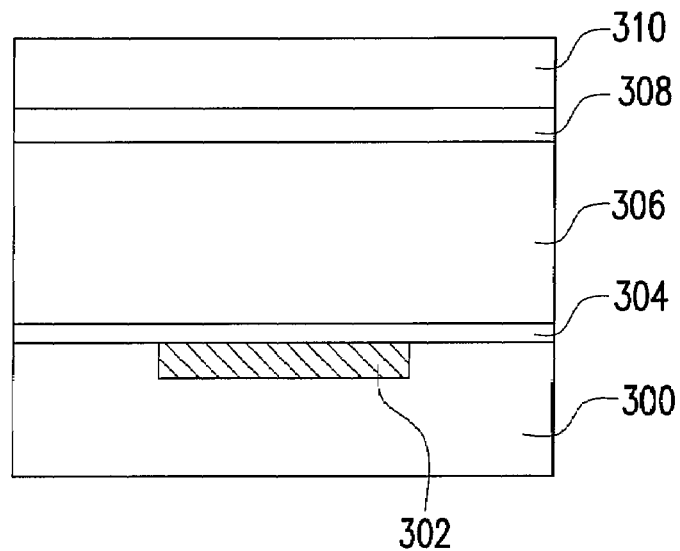
FIGS. 3A through 3D are cross-sectional schematic views illustrating a single damascene process according to another embodiment of the present invention.
Figure 3B:
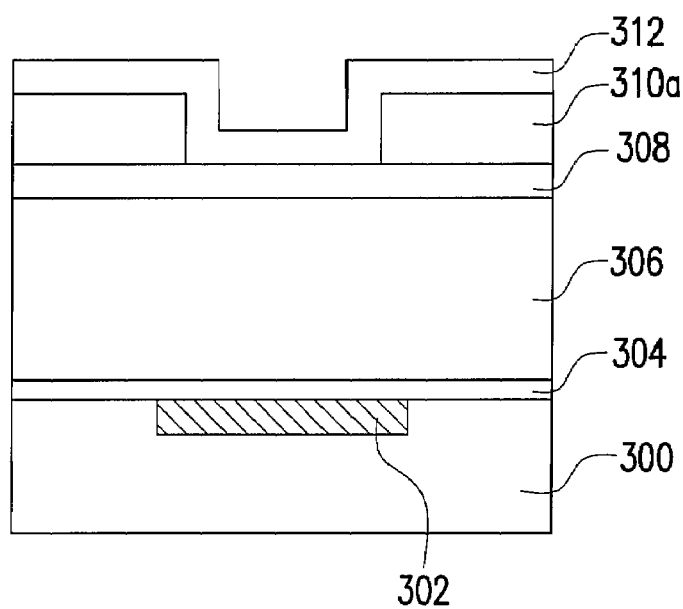

Next, with reference to FIG. 3B, the metal hard mask layer 310 is patterned to form a patterned metal hard mask layer 310a having a trench opening. The patterned metal hard mask layer 310a exposes a region for forming an opening in a subsequent process. After that, a dielectric hard mask layer 312 is formed conformally over the patterned metal hard mask layer 310a and filled in the trench opening. The material of the dielectric hard mask layer 312 is, for example, silicon oxide, and a method of forming the dielectric hard mask layer 312 includes performing the CVD process, for example. In the present embodiment, the material of the dielectric hard mask layer 312 is, for example, silicon oxide using TEOS as a gas source. However, in other embodiments, it is certain that the material of the dielectric hard mask layer 312 may be silicon carbide (SiC), SiCN or other appropriate dielectric materials.

Figure 3C:
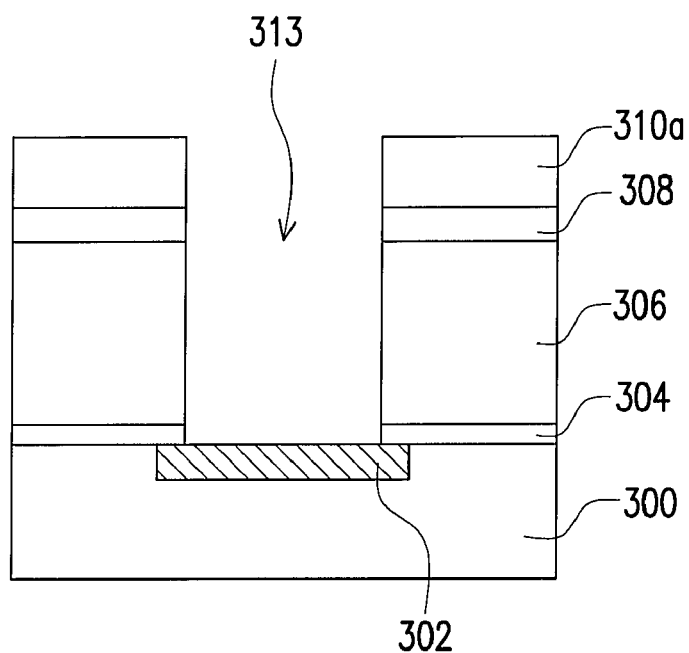

After that, with reference to FIG. 3C, another etching process is then carried out with use of the patterned metal hard mask layer 310a as the mask to form an opening 313 in the dielectric layer 306. Here, the opening 313 exposes a portion of the cap layer 304 above the conductive region 302. Next, the cap layer 304 exposed by the opening 313 is removed to expose a portion of the conductive region 302.

Figure 3D:
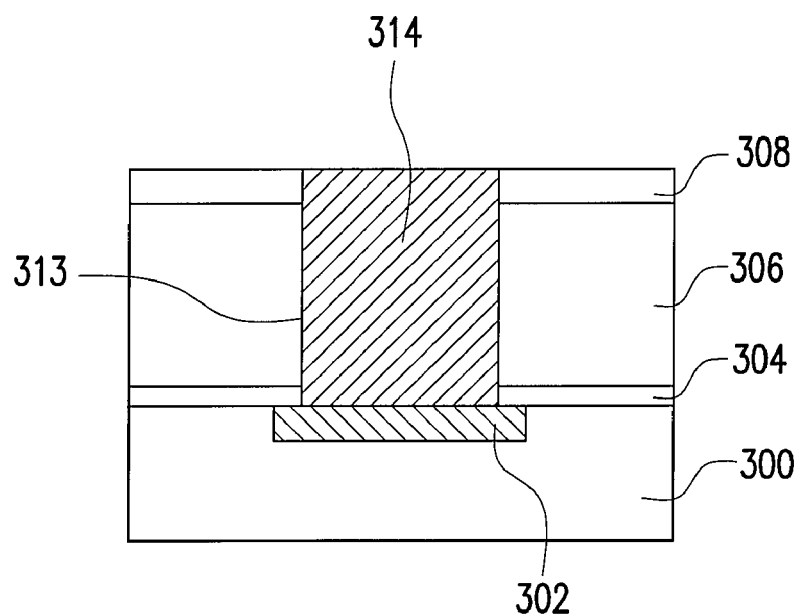

Then, referring to FIG. 3D, a conductive layer 314 is formed in the opening 313, such that the conductive layer 314 can be electrically connected to the conductive region 302, and thereby the single damascene process is completed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An interconnection process, comprising:
   providing a substrate having a conductive region;
   forming a dielectric layer on the substrate;
   forming a patterned metal hard mask layer having a trench opening on the dielectric layer;
   conformally forming a dielectric hard mask layer on the patterned metal hard mask layer, wherein the dielectric hard mask layer lines a surface of the trench opening;
   defining a photoresist pattern to remove a portion of the dielectric hard mask layer and a portion of the dielectric layer in the trench opening to form an opening, wherein the opening exposes the conductive region;
   forming a passivation layer in the opening;
   removing the photoresist pattern;
   performing a first etching process with use of the patterned metal hard mask layer as a mask to form a trench in the dielectric layer, wherein the dielectric hard mask layer is removed during the first etching process;
   removing the passivation layer; and
   forming a conductive layer in the trench and in the opening.

2. The interconnection process of claim 1, wherein the material of the dielectric hard mask layer comprises silicon oxide.

3. The interconnection process of claim 1, wherein the material of the patterned metal hard mask layer comprises TiN, TaN or a titanium-tungsten alloy.

4. The interconnection process of claim 1, wherein the conductive region comprises a conductive wire or an electrode.

5. The interconnection process of claim 1, wherein the material of the dielectric layer comprises the dielectric material with low dielectric constant.

6. The interconnection process of claim 1, wherein the material of the conductive layer comprises copper or tungsten.

7. The interconnection process of claim 1, wherein a method of forming the opening comprises:
   forming a patterned photoresist layer on the dielectric hard mask layer;
   performing a second etching process with use of the patterned photoresist layer as a mask to remove a portion of the dielectric hard mask layer and a portion of the dielectric layer until the conductive region is exposed; and
   removing the patterned photoresist layer.

8. The interconnection process of claim 1, wherein a cap layer is further formed on the substrate before the step of forming the dielectric layer.

9. The interconnection process of claim 1, wherein a polishing stop layer or a glue layer is further formed on the dielectric layer after the dielectric layer is formed and before the patterned metal hard mask layer is formed.

10. The interconnection process of claim 1, wherein a method of forming the passivation layer comprises:
    forming a passivation material layer over the substrate; and
    performing an etching back process to remove the passivation material layer outside the opening.

11. The interconnection process of claim 1, wherein a method of forming the conductive layer comprises:
    forming a conductive material layer over the substrate; and
    performing a planarization process to remove the conductive material layer outside the trench and the opening.

* * * * *